United States Patent
Kumar et al.

(10) Patent No.: US 7,209,060 B2
(45) Date of Patent: Apr. 24, 2007

(54) REDUCING VARIATION IN REFERENCE VOLTAGE WHEN THE LOAD VARIES DYNAMICALLY

(75) Inventors: Abhaya Kumar, Bangalore (IN); Visvesvaraya A Pentakota, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/161,253

(22) Filed: Jul. 28, 2005

(65) Prior Publication Data

US 2007/0024485 A1    Feb. 1, 2007

(51) Int. Cl.
 *H03M 1/06* (2006.01)
(52) U.S. Cl. .................. 341/118; 341/120; 341/121; 341/172
(58) Field of Classification Search ................ 341/118, 341/120, 122, 123, 155, 161, 172
See application file for complete search history.

(56) References Cited

U.S. PATENT DOCUMENTS

| | | | | |
|---|---|---|---|---|
| 5,412,387 | A  * | 5/1995 | Vincelette et al. | 341/150 |
| 5,451,950 | A  * | 9/1995 | Vincelette et al. | 341/150 |
| 6,559,787 | B1 * | 5/2003 | Aude et al. | 341/161 |
| 6,836,228 | B1 * | 12/2004 | Levinson et al. | 341/136 |
| 6,906,658 | B2 * | 6/2005 | Pentakota et al. | 341/172 |
| 7,095,356 | B1 * | 8/2006 | Pentakota et al. | 341/172 |
| 2006/0038712 | A1 * | 2/2006 | Harrison et al. | 341/155 |

* cited by examiner

*Primary Examiner*—Linh Nguyen
(74) *Attorney, Agent, or Firm*—W. James Brady, III; Frederick J. Telecky, Jr.

(57) ABSTRACT

Providing a substantially constant reference voltage to a component from a reference buffer connected by a path. The load that would be offered to the reference buffer in desired durations is estimated, and a dummy load is added to the path such that the aggregate load on the path is approximately constant. In case of the stages of an ADC, the sub-code generated by each stage during a sampling phase is used to estimate the load that would be offered, and the dummy load is added in the hold phase to keep the reference voltage constant in the hold phase, as desired.

20 Claims, 12 Drawing Sheets

REDUCING VARIATION IN REFERENCE VOLTAGE WHEN THE LOAD VARIES DYNAMICALLY

BACKGROUND

1. Field of the Invention

The present invention relates generally to the design of buffers providing constant voltage, and also to its application in the design and implementation of a multi-stage ADC.

2. Related Art

Constant reference voltages are needed in several environments. An example of such environment in which analog to digital converters (ADC) are used. An ADC refers to a component which receives an analog signal as input and provides (generates) a digital code corresponding to strength of the analog signal at various time instances (samples) as output. In an embodiment, the digital code equals ($Vi*2^n$/Vref), wherein Vi represents the voltage of the input sample, Vref the reference voltage, * and / representing the multiplication and division operations respectively.

Thus, ideally Vref provided to the ADC should be constant such that the digital codes are linearly proportionate to the voltage level of the input samples. A deviation of the reference voltage from such constant value leads to corresponding errors in the digital codes. An example ADC needing a constant reference voltage is described with reference to FIG. 1 below.

Figure 1:
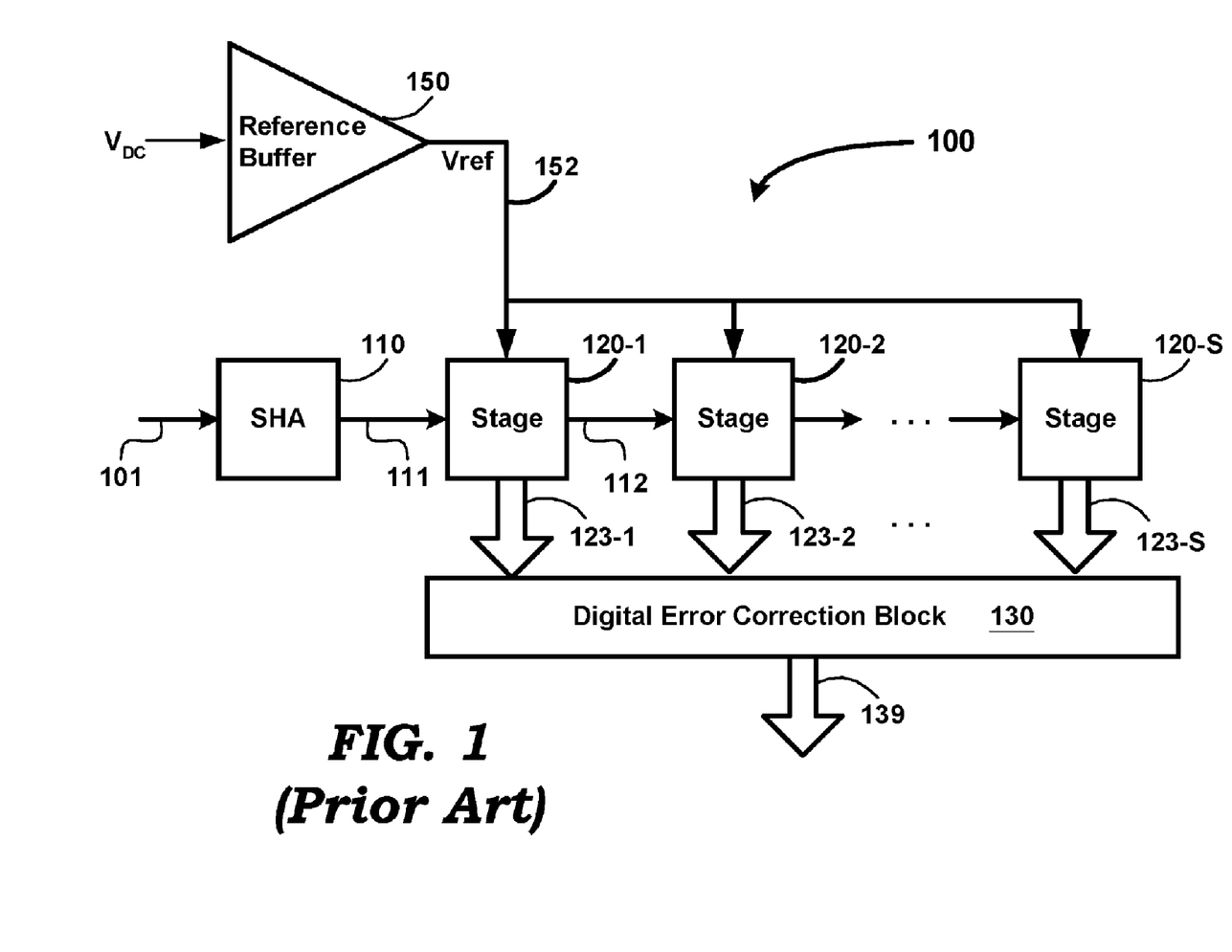
FIG. 1 is a block diagram illustrating the internal structure of an example prior multistage ADC.

FIG. 1 is a block diagram of a pipe line ADC in one embodiment illustrating the need for a constant reference voltage. ADC 100 is shown containing sample and hold amplifier (SHA) 110, stages 120-1 through 120-S, digital error correction block 130 and reference buffer 150. Each block is described below in further detail.

Reference buffer 150 generates a reference voltage (Vref) on path 152 typically from a constant DC reference voltage (e.g., bandgap reference voltage, well known in the relevant arts). The reference voltage can be in differential and/or single ended form depending on the requirements of the other components using the voltage. In order to avoid obscuring the features of the present invention, the description henceforth is provided with reference to single ended implementations. The extension of the approaches to differential circuits will be apparent to one skilled in the relevant arts by reading the disclosure provided herein, and such implementations are contemplated to be covered by various aspects of the present invention.

SHA 110 samples the input analog signal received on path 101 and holds the voltage level of the sample on path 111 for further processing. Digital error correction block 130 receives sub-codes from various stages (on paths 123-1 through 123-S respectively), and generates a digital code corresponding to the sample received on path 101. Various error correction approaches, well known in the relevant arts, may be used to correct any errors in the received sub-codes. The generated digital code is provided on path 139 as a final digital code corresponding to the voltage of a sample on the input analog signal at a particular time instant.

Figure 2:
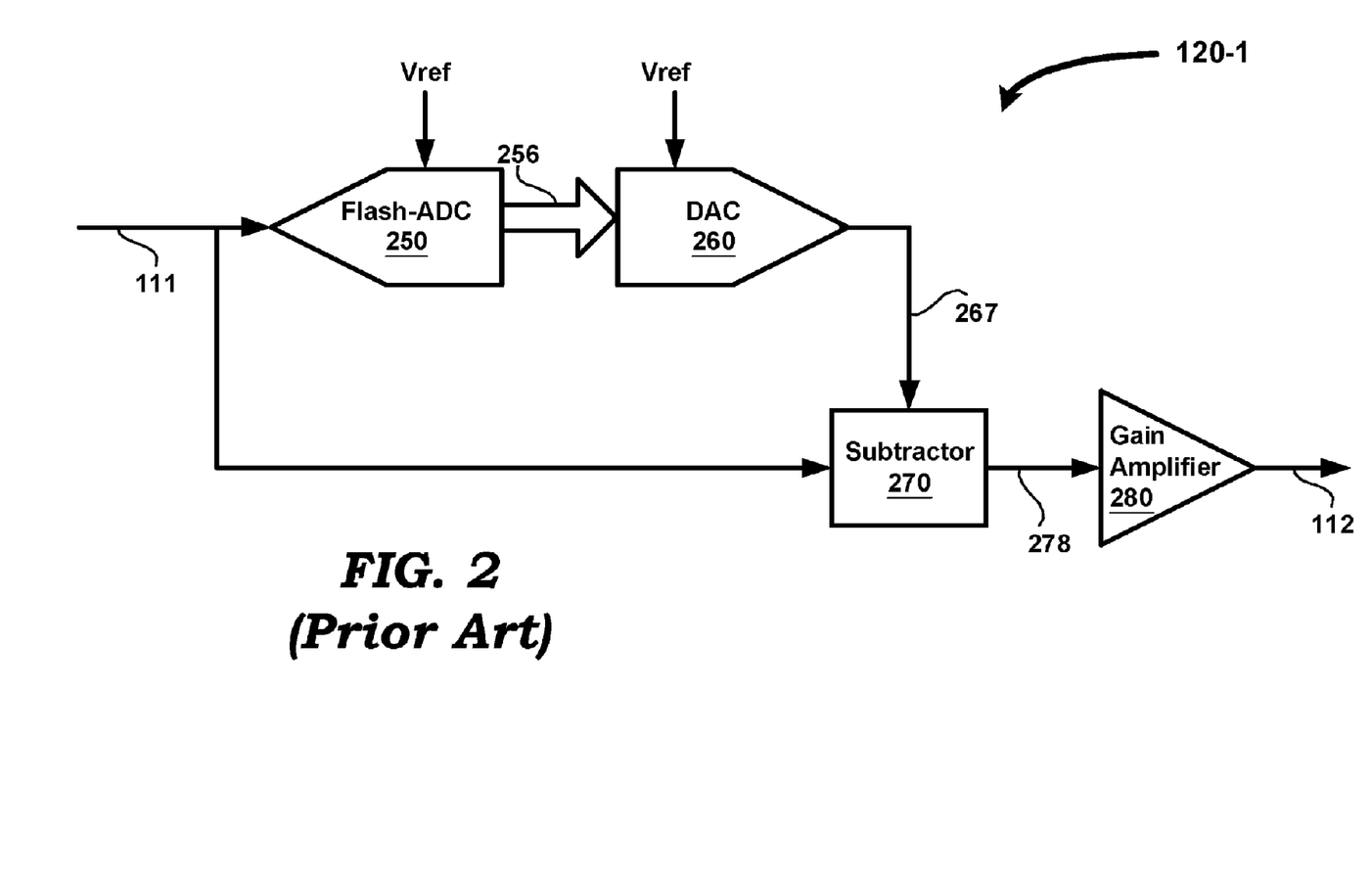
FIG. 2 is a block diagram illustrating the general operation of a stage of a prior ADC.

Each stage 120-1 through 120-S generates a sub-code (based on the reference signal Vref received on path 152) corresponding to a voltage level of an analog signal received as an input, and an amplified residue signal as an input to a (any) next stage. For example, stage 120-1 converts a voltage level on path 111 to generate a sub-code on path 123-1, and the amplified residue signal generated on path 112 is provided as an input to stage 120-2. A common reference signal Vref is provided to stages 120-1 through 120-S. FIG. 2 further illustrates (logical) components contained in each stage (described with reference to stage 120-1 only, for conciseness) of a pipe line ADC according to a known approach.

With respect to FIG. 2, stage 120-1 is shown containing flash ADC 250, digital to analog converter (DAC) 260, subtractor 270 and gain amplifier 280. Flash ADC 250 (an example of a sub ADC) converts a sample of an analog signal received on path 111 into a corresponding p-bit sub-code provided on path 256 (contained in path 123-1 of FIG. 1, and P is less than N). DAC 260 converts the sub-code received on path 256 into corresponding analog signal (Vdac) on path 267.

Subtractor 270 generates a residue signal as the difference of sample 111 (Vi) and the analog signal received on path 267. Gain amplifier 280 amplifies the residue signal (Vi–Vdac) and is provided on path 112 as an amplified residue signal. The signal on path 112 is used to resolve the remaining bits in the N-bit digital code by the subsequent stages of the ADC. The manner in which the residue signal is generated by each stage is described below with respect to FIGS. 3A and 3B.

Figure 3A:
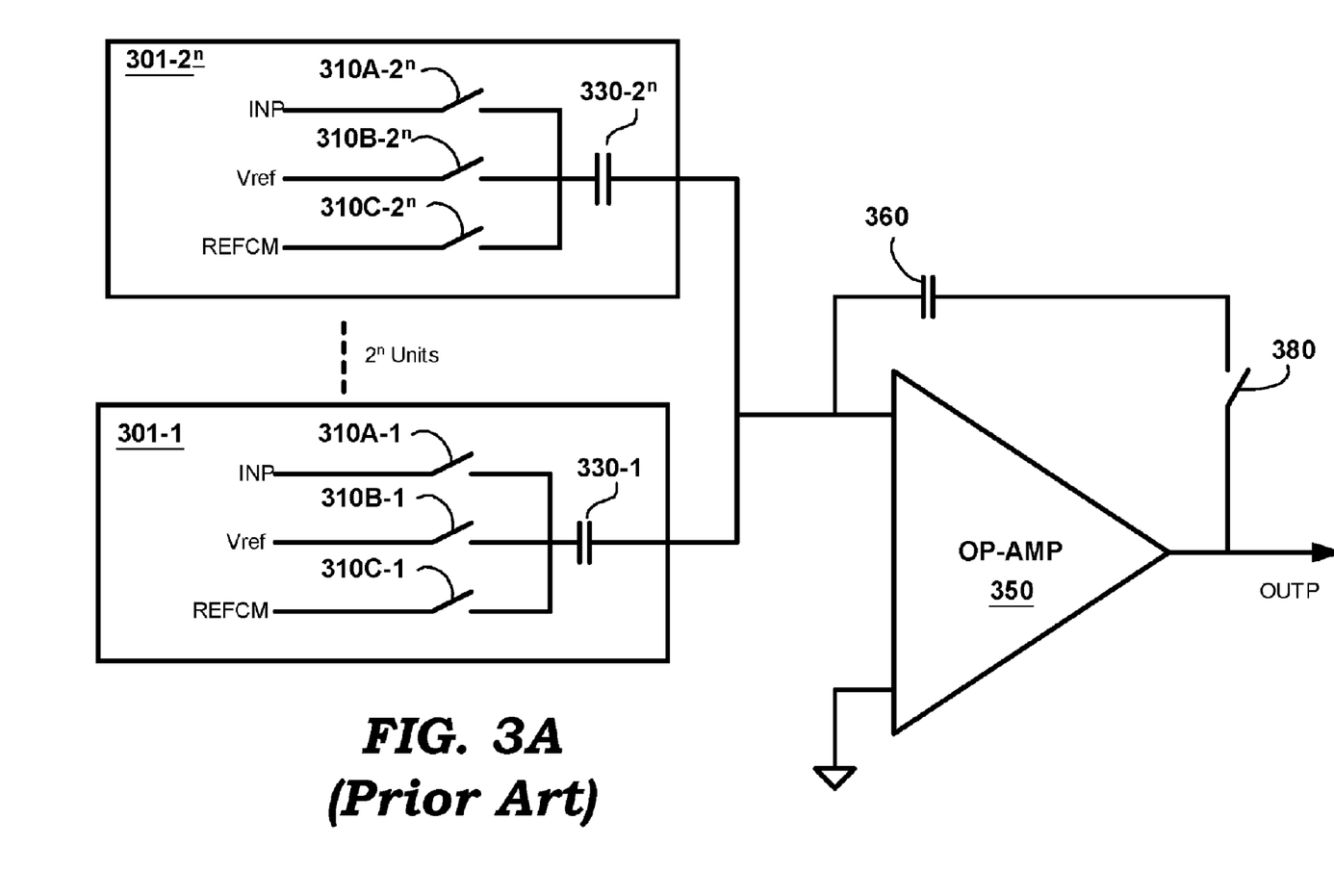
FIG. 3A is a circuit diagram of the implementation of a DAC, residue amplifier and a subtractor of a stage according to a prior approach.
Figure 3B:
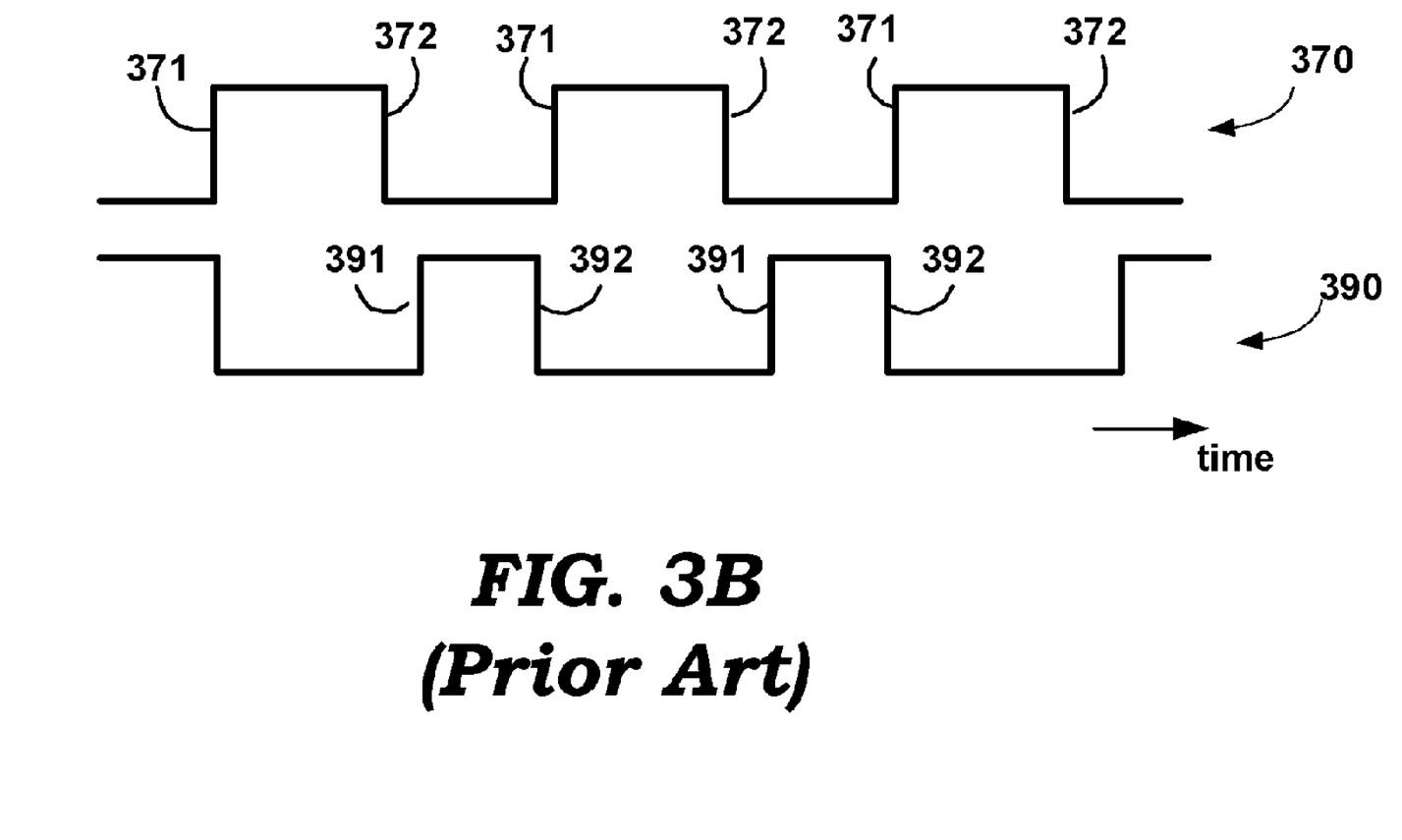
FIG. 3B is a timing diagram illustrating the sampling and hold phases of a stage of an ADC in one embodiment.

FIG. 3A is a circuit diagram illustrating the manner in which DAC 260, subtractor 270, and gain amplifier 280 are implemented in an embodiment providing p-bit sub-codes and FIG. 3B is a timing diagram used to illustrate the sample and hold phases of the circuit. The circuit diagram is shown containing op-amp 350, feedback capacitor 360, feedback switch 380 and circuit portions 301-1 through 301-2". Circuit portions 301-1 is shown containing sampling capacitor 330-1, switch 310A-1, 310B-1and 310C-1. The remaining circuit portions 310-2 through 310-2" may also contain similar components, and are not described in the interest of conciseness. Each component is described below in further details.

The circuit in FIG. 3A operates using two phase signals, shown as sampling phase 370 and hold phase 390. In the first phase (sampling phase 370) switches 310A-1 through 310A-2" are closed at time points 371 and the remaining switches 380, 310B-1 through 310B-2", and 310C-1 through 310C-2" are kept open. As a result, each sampling (input) capacitor 330-1 through 330-2" is ideally charged (in duration between 371–372) to the voltage of input sample received on path 111 by time point 372.

In the second phase (between durations 391–392), feedback switch 380 is closed and switches 310A-1 through 310A-2" are kept open. Connections of switches 310B-1 through 310B-2, and 310C-1 through 310C-2" are made such that the input terminals of each sampling capacitors 330-1 through 330-2" is connected either to Vref or to REFCM terminal, as determined from the output of flash ADC 250. As a result, capacitors 330-1 through 330-2" transfers a charge proportional to the difference (residue) of input signal and the Vref or REFCM to feedback capacitor 360 (up to time point 392). The residue is amplified by op-amp 350 and provided as amplified residue signal to the next stage, as desired.

However, the reference voltage Vref (on path 152) provided by reference buffer 150 may not remain constant (across stages while processing the same sample, and also while processing different samples) due to variation in the load offered by the circuit of FIG. 3A. Such a variation of the reference voltage Vref causes an error in the residue signal and/or quantization, resulting in error in the sub-codes generated by various stages.

Therefore, what is needed is a method and apparatus which at least reduces the variation in reference voltage even when the offered (e.g., by the circuit of FIG. 3A in the above example) load varies dynamically.

BRIEF DESCRIPTION OF THE DRAWINGS

The present invention will be described with reference to the following accompanying drawings.

In the drawings, like reference numbers generally indicate identical, functionally similar, and/or structurally similar elements. The drawing in which an element first appears is indicated by the leftmost digit (s) in the corresponding reference number.

DETAILED DESCRIPTION

1. Overview

An aspect of the present invention reduces variation in reference voltage provided to a component by determining the magnitude of the load that would otherwise be offered (hereafter "actual load") to the output of a reference buffer providing the reference voltage, and adding additional load ("dummy load") on the path on which the reference voltage is provided, to ensure that the aggregate load offered on the path equals a (substantially) constant value. Due to the effective constant load at the output of the reference buffer, variation in the reference voltage may be reduced at multiple durations of interest by various components connected to the path.

In one embodiment, the reference voltage is provided in a hold phase following a sampling phase in a stage of an analog to digital converter (ADC). The actual load that would be offered by the stage is determined by the digital sub-code generated by the stage before the hold phase, and the required dummy load is determined based on the digital sub-code. The determined dummy load is also applied to the output of the reference buffer to ensure that the variation in the reference voltage is reduced in the hold phase, irrespective of the magnitude of the actual load.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well known structures or operations are not shown in detail to avoid obscuring the features of the invention.

2. Invention

Figure 4:
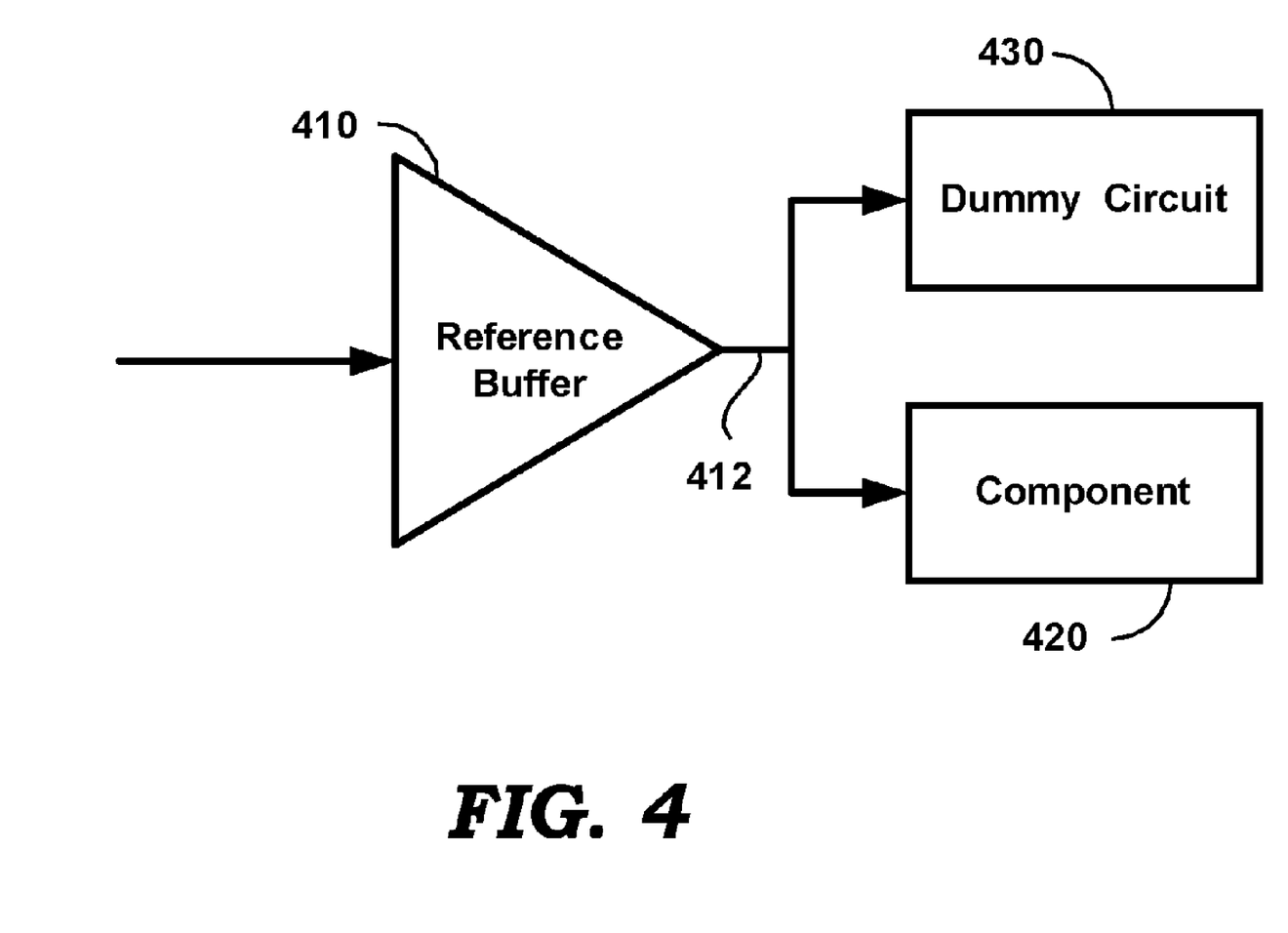
FIG. 4 is a block diagram illustrating the manner in which variation in reference voltage is reduced according to an aspect of the present invention.
Figure 5:
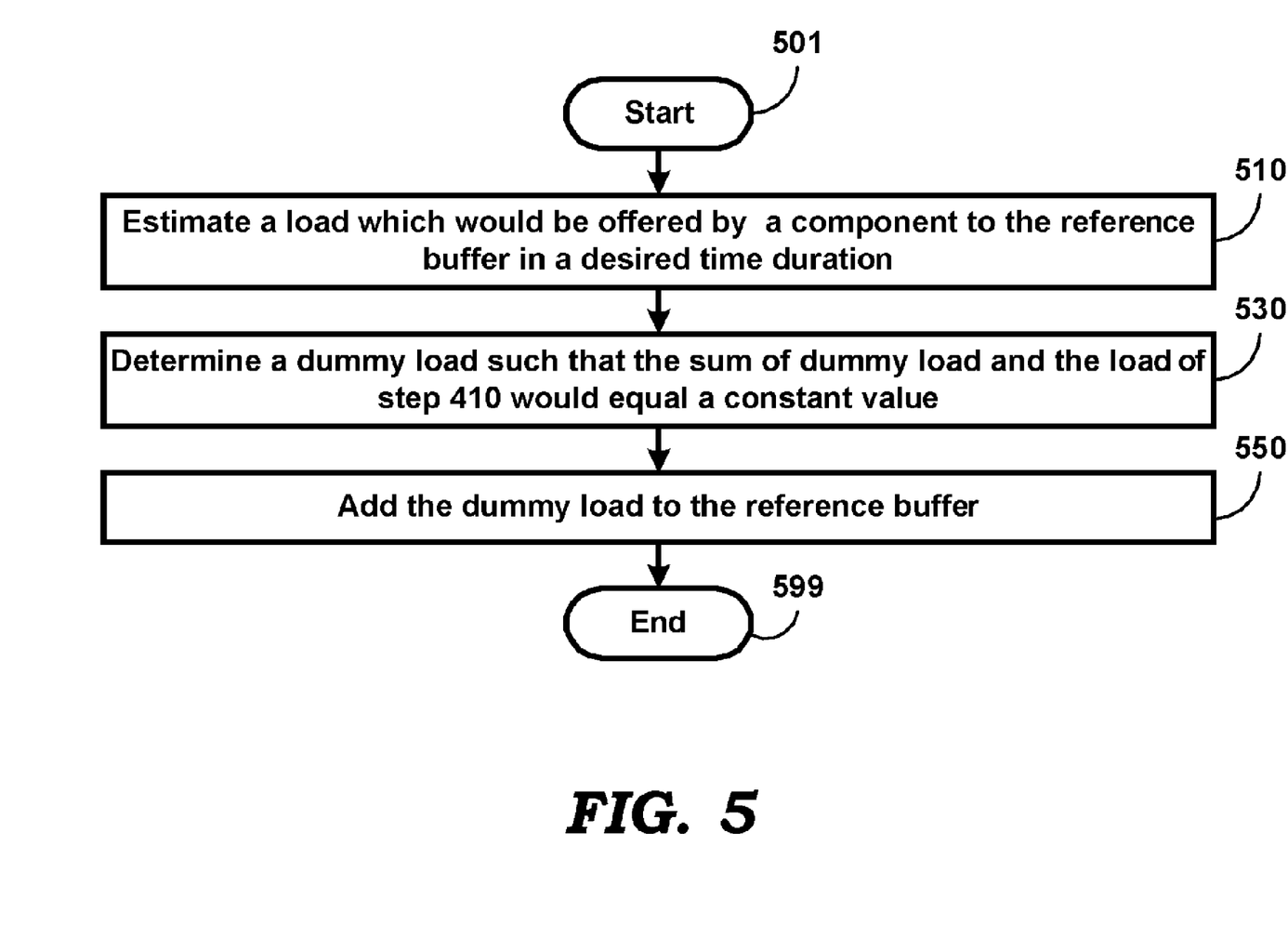
FIG. 5 is flowchart illustrating the implementation of ADC in an embodiment of the present invention.

Various aspects of the present invention are described with respect to FIGS. 4 and 5. FIG. 4 is shown with reference buffer 410 providing a reference voltage (Vref) to component 420 on path 412, with component 420 being designed to present a varying load ("actual load") during operation. Dummy circuit 430 (which is provided as a variable load that can be set to a desired magnitude) provides a dummy load, which is added on path 412 according to various aspects of the present invention as described below with respect to FIG. 5.

Dummy circuit 430 is interchangeably referred to as a dummy load also in the description below. In addition, while the dummy load is provided by dummy circuit 430, which is described as exclusively dedicated for providing the desired magnitude of dummy load, such load can be designed to be added by circuits (which can also be referred to as dummy circuits) which provide other useful function(s).

The flow chart of FIG. 5 begins in step 501 and control passes to step 510. The flowchart is described with respect to FIG. 4 merely for illustration. In step 510, the load (actual load) which would be offered by component 420 during a desired time duration is estimated. The load can vary (be different) in different time durations of interest and that the actual load may need to be estimated (or determined) in the specific durations of interest.

In step 530, a specific magnitude of dummy load is determined for each specific duration of interest such that the sum of dummy load and the actual load of step 510 would equal a substantially constant value. In general, it is desirable to keep the constant value close to zero (by use of negative value of load). However, constant value may be set to maximum permissible (positive) value of actual load for simplicity of implementation.

In step 550, the determined magnitude of the dummy load is also added to the reference buffer. With reference to FIG. 4, the magnitude of the dummy load (offered by dummy circuit 430) is set to the determined magnitude such that the total aggregate load at path 412 equals the constant value at all durations of interest.

Due to the use of such dummy load on path 412, a (substantially) constant load is provided to reference buffer 410 irrespective of variation in the load offered by component 420. The flowchart ends in step 599.

Accordingly, the reference voltage on path 412 may be susceptible to less variation with respect to the load offered by component 420. Hence, component 420 may receive a constant reference voltage (lesser variation) in all durations of interest. The flowchart ends in step 599. Each step of the flow chart is described in further detail below.

3. Estimating Actual Load

Various approaches can be used to determine the actual load at desired time durations (hold phase with respect to the embodiment of FIG. 3A, as described in sections below). According to one approach, the implementation and operation of component 420 is examined to determine the actual load at a desired time duration. For illustration, description is provided below for determining actual load offered by the circuit of FIG. 3A.

By examining the circuit of FIG. 3A (switched capacitor circuit), it may be appreciated that one reason for the varying load offered by the switched capacitor circuit is the varying voltage level of the input signal, which would correspondingly deviate from the reference voltage (Vref). Another reason for such load variation is due to the number of capacitors connected to Vref depends on the output of the flash ADC 250. Each factor is described with respect to an example stage 120-1 below in further detail.

The description is continued by assuming stage 120-1 provides a 3-bit sub-code for illustration. Hence, circuit portion 301-1 in FIG. 3A is repeated for $2^3$ times (n=3 corresponding to $2^n$ of FIG. 3A). During the sampling phase(s) (between time points 371 and 372 of FIG. 3B), all $2^3$ (equal to 8) sampling capacitors (330-1 through $330\text{-}2^3$) are connected to the input terminal, resulting in all the 8 capacitors being charged to corresponding input value. On the other hand during hold phase(s) (between time points 391 and 392 of FIG. 3B), a selected number of sampling capacitors (based on the sub-code) are connected to the Vref and remaining capacitors are connected to REFCM terminal. As a result, the capacitive load offered by the switched capacitor circuit (in durations 391–392) of FIG. 3A is given as:

$$C_L = C_n(Vref - Vin)/Vref \qquad \text{Equation (1)}$$

wherein $C_n$ represents the capacitance value of all the capacitors connected to Vref, and Vin represents the sampled input voltage.

From Equation 1, it may be appreciated that when the input signal equals Vref, the capacitive load offered by switched capacitor circuit of FIG. 3A is zero. Similarly, when the input signal value is equal to 0, no capacitor is connected to Vref (since sub-code equals zero), thereby resulting again in zero capacitive load. However, when the input signal is between 0 and Vref the capacitive load exhibits a quadratic relation with the input signal as described below with respect to FIG. 6.

Figure 6:
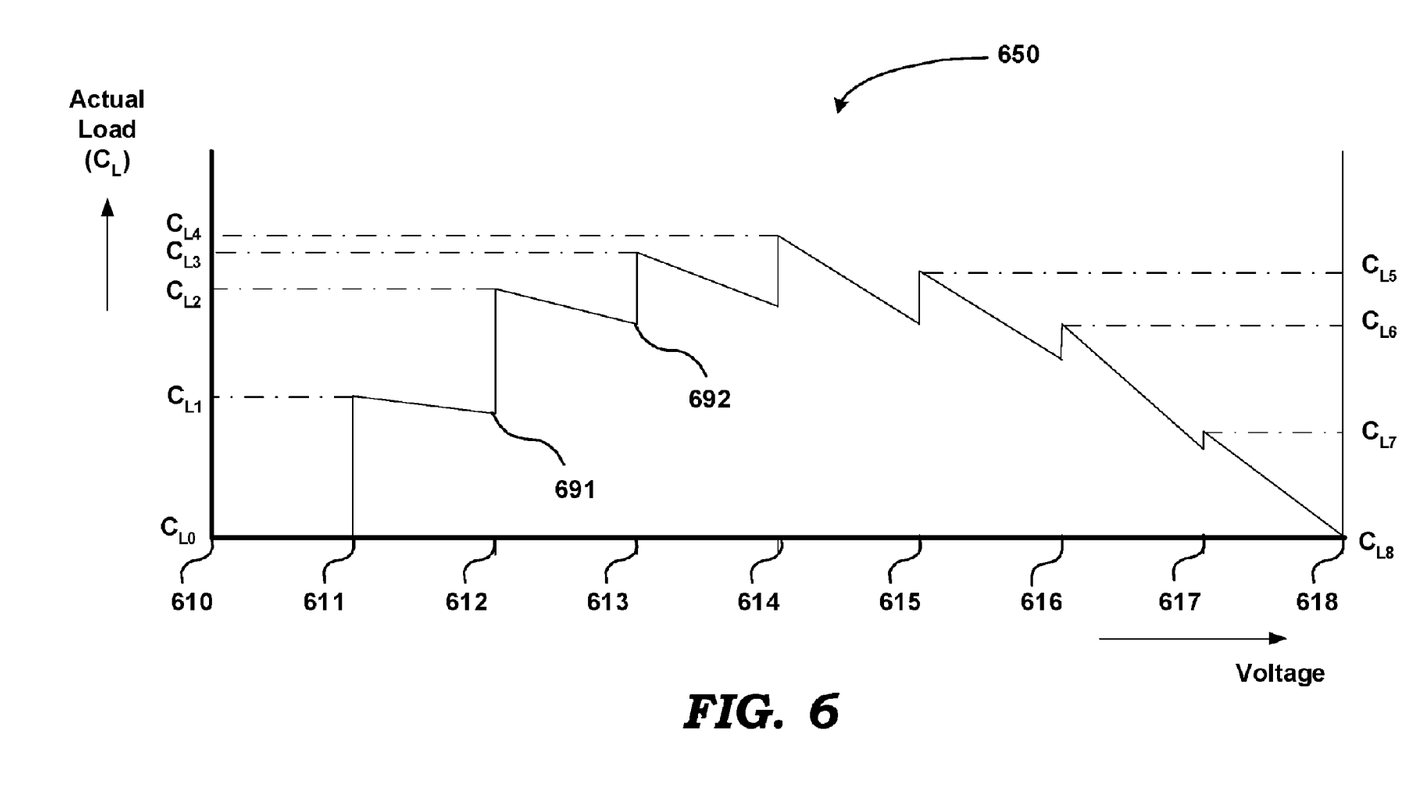
FIG. 6 is a graph illustrating the relationship between the input voltages and variation of capacitive load to the reference buffer in an embodiment of the present invention.

FIG. 6 is a graph illustrating the variation of capacitive load ($C_L$ offered to reference buffer 150) with respect to the voltage levels on input signal (received by stage 120-1). The graph is shown with x-axis representing voltage level of the input signal and Y axis representing capacitive load ($C_L$). Curve 650 represents variation in capacitive load ($C_L$ of Equation (1) above) with respect to the voltage level of the input signal, as described below in further detail.

Points 610–618 on X-axis represents different threshold levels (comparator levels in flash ADC 250) at which the sub-code changes. Curve 650 is shown containing points $C_{L0}$–$C_{L8}$, wherein points $C_{L0}$–$C_{L8}$ respectively represent capacitive load offered at points 610–618 by the switched capacitor circuit.

Capacitive load 650 equals to zero between points 610 and 611 since the sub-code generated represents a value 0 (all the comparator output are zero). Accordingly none of sampling capacitors 330-1 through $330\text{-}2^3$ are connected to Vref resulting in zero capacitive load as shown.

The capacitive load equals $C_{L1}$ when the input voltage reaches point 611 corresponding to a sub-code value of 1. The value of $C_{L1}$ equals C1(Vref−Vin)/Vref wherein C1 represents the capacitance value of each of the sampling capacitors. However, the capacitive load is shown decreasing (to 691) thereafter (between points 611 and 612) due to fact that any increase in input voltage from Vref/8 decreases the factor (Vref−Vref/8)/Vref of Equation (1) noted above.

Similarly, the capacitive load equals $C_{L2}$ at point 612 (corresponding to sub-code values 2). The value of $C_{L2}$ equals 2*C1(Vref−Vin)/Vref. Again, the capacitive load is shown decreasing to 692 thereafter between the points 612 and 613 due to the fact that any increase in input voltage from 2*vref/8 to 3*Vref/8 decreases the factor (Vref_Vin)/Vref of Equation (1) noted above. However after mid-point 614 (corresponding to Vref/2) on curve 650, the second factor of Equation (1) becomes a progressively smaller component until a zero value is reached at point 618.

Thus, using approaches such as those described above, the actual load offered by component 420 may be estimated. Once the actual load is determined under various scenarios of interest, as above, the dummy load can be determined, as described below with the example circuit of FIG. 3A.

4. Determining Dummy Load

Figure 7:
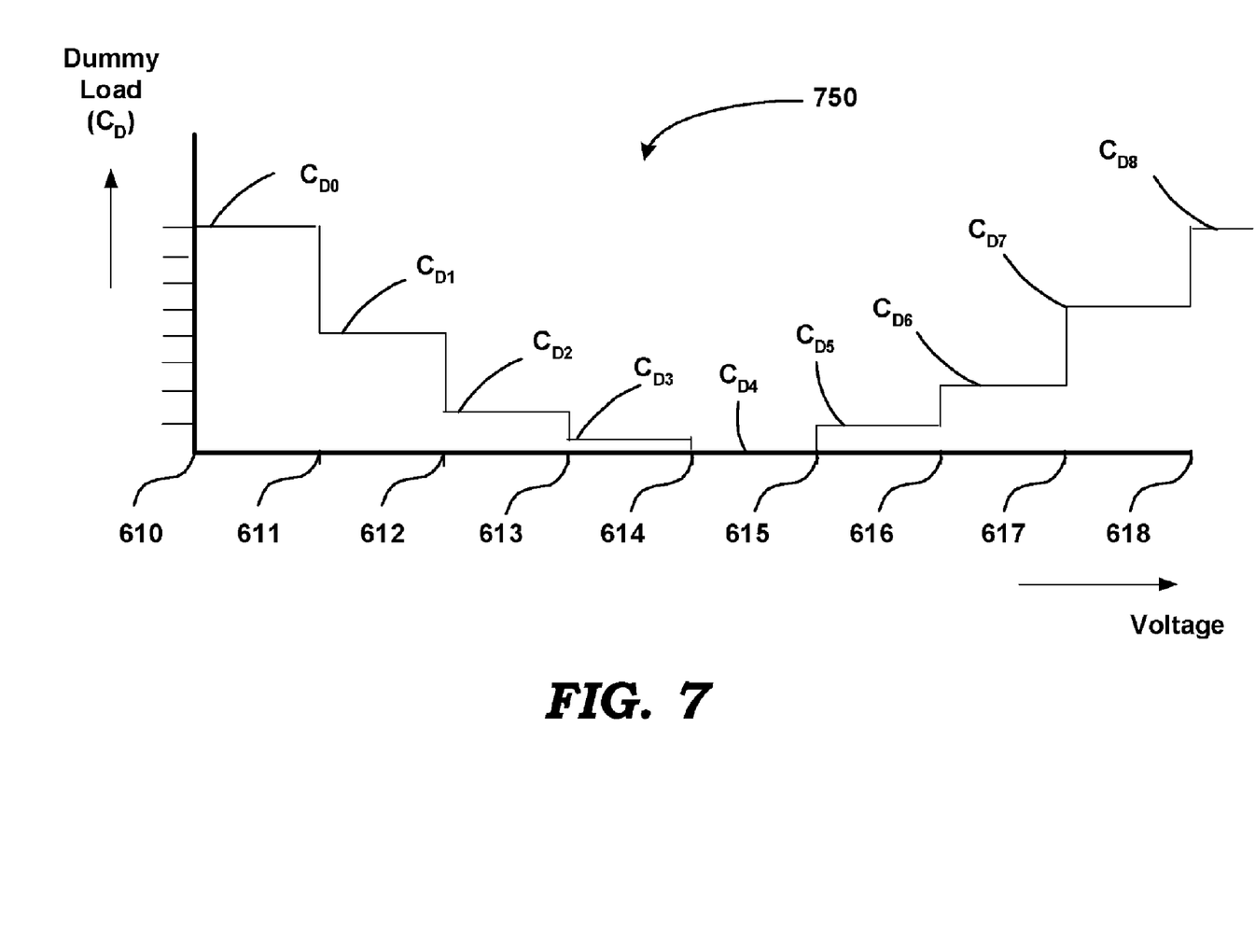
FIG. 7 is a graph illustrating the magnitude of the dummy load to be connected to a path corresponding to the voltage levels of the input signal in an embodiment of the present invention.

FIG. 7 is a graph illustrating the magnitude of the dummy load to be connected to path 412 corresponding to the voltage levels of the input signal in an embodiment of the present invention. In the graph, X-axis represents the voltage levels (containing voltage points 610–618, as in FIG. 6) of the input signal, and Y-axis represents dummy load value $C_D$.

Ideally, curve 750 should be complementary to curve 650, with the points corresponding to the same input voltage adding to a fixed value. However, for convenience of implementations, curve 750 may vary in minor respects within acceptable error limits as described below.

Levels $C_{D0}$–$C_{D8}$ on curve 750 represents the dummy load values connected to path 412 when input voltage level is in the ranges 610–611, 611–612, 612–613, . . . , 617–618 respectively. For simplicity, each level $C_{D0}$–$C_{D8}$ are shown as horizontal levels (instead of with a slight positive slope, which would have precisely complemented curve 650). The manner in which dummy loads $C_{D0}$–$C_{D8}$ are estimated is described below in further detail.

Dummy loads $C_{D0}$–$C_{D8}$ are determined to provide a constant load equaling a pre-specified value $C_{LM}$ at all time duration (or for all voltage levels of the input signal). In one embodiment, $C_{LM}$ is designed to equal to the maximum possible value of the actual load.

Dummy loads $C_{D0}$ through $C_{D8}$ are estimated by subtracting a corresponding actual load ($C_{L0}$–$C_{L8}$) from the maximum load $C_{LM}$ ($C_{dn} = C_{LM} - C_{Ln}$ for each n values from 0 to 8). For example, in range 610–611, the actual load $C_{L0}$ equals zero hence the dummy load $C_{D0} = C_{LM} - 0$. Accordingly a dummy load of $C_{LM}$ is connected to path 412 when the sub-code equals 0 (between point 610 and 611).

Similarly, between 611 and 612, the actual load equals $C_{L1}$, and accordingly a dummy load $C_{D1}$ having value ($C_{LM} - C_{L1}$) is connected to path 412 when the sub-code value equals 1 (between point 611 and 612). Similarly, for each sub-code value, the corresponding dummy load values may be determined as described above.

Figure 10:
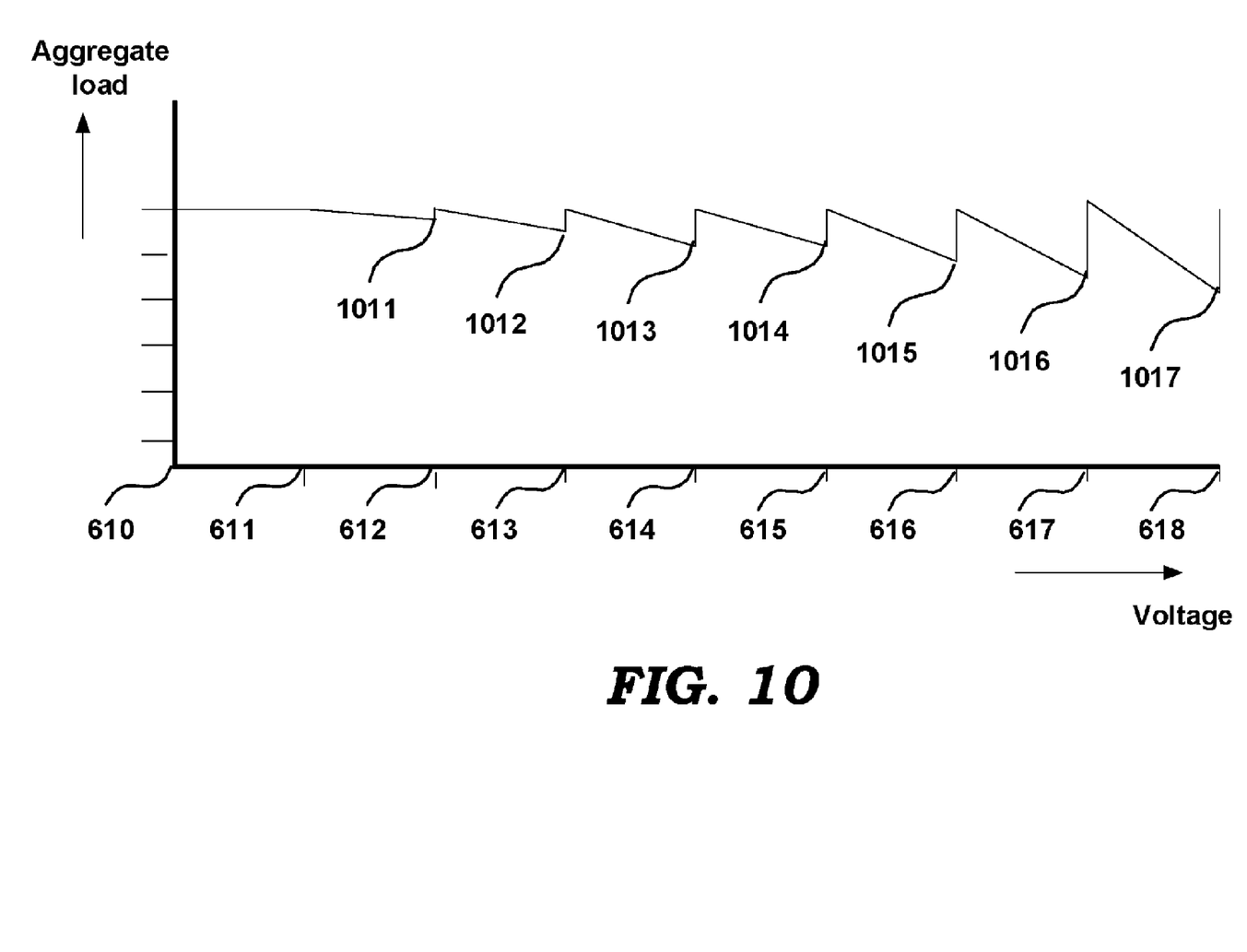
FIG. 10 is graph illustrating the aggregate load seen by reference buffer in one embodiment of the present invention.

An example dummy load implemented to provide dummy load values of FIG. 7 based on sub-code values received from flash ADC 250 is described below in further detail. The aggregate load ($C_{LM}$) used is then described with respect to FIG. 10.

5. Implementation of Dummy Load

Figure 8:
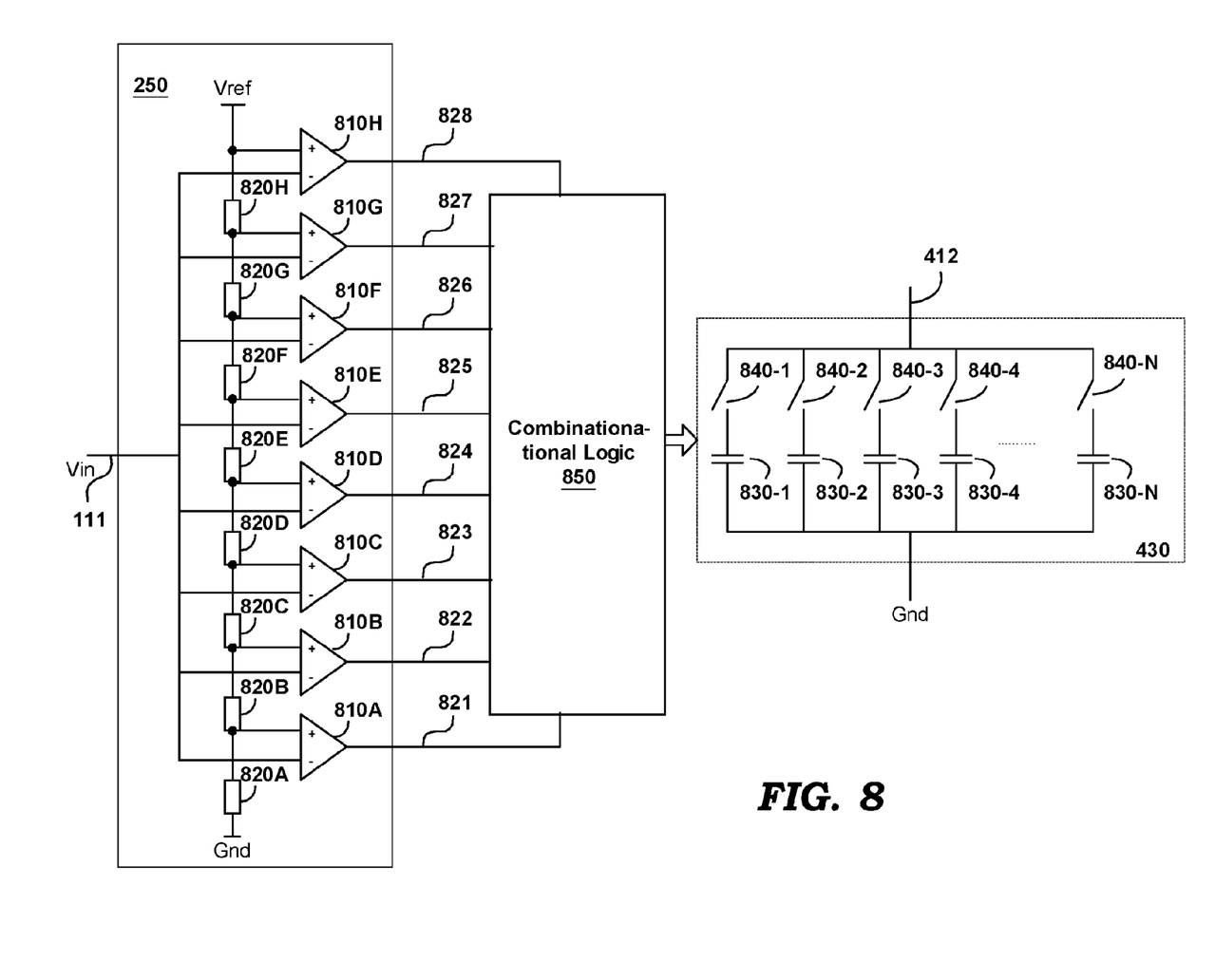
FIG. 8 is a circuit diagram illustrating the implementation of dummy load in an embodiment of the present invention.

FIG. 8 is a block diagram illustrating the manner in which dummy load 430 is implemented in an embodiment in which component 420 corresponds to the circuit of FIG. 3A. The block diagram is shown containing the details of flash ADC 250, the details of dummy load 430, and combinatorial logic 850 in between. Flash ADC 250 is shown containing comparators 810A–810H and resistors 820A–820H, and dummy load 430 is shown containing capacitors 830-1 through 830-N and switches 840-1 through 840-N. Each component is described below in further detail.

Dummy load 430 is used to provide a desired load by closing a corresponding set of switches 840-1 through 840-N. As may be appreciated, the specific capacitors in series with the closed switches, are in parallel connection configuration, and the capacitance values add to provide the total load on path 412. The load offered by each capacitor (when the corresponding switch is closed) equals capacitance offered by the capacitor*Vref on path 412, wherein * represents a multiplication operation.

Resistors 820A–820H having an equal resistance value are connected (as a resistor ladder network, as is well known in the relevant art) to generate 8 threshold voltage levels Vref/8 (611), 2*Vref/8 (612), . . . , Vref from a reference voltage Vref. The threshold values Vref/8, 2*Vref/8, through Vref are respectively connected to positive terminal of comparators 810A through 810H. The negative terminal of each comparator 810A through 810H is provided with samples of the input signal (111).

Accordingly, a 8-bits digital code (output of each comparator 810A–810H contributing one bit to the total 8 bit digital code) represents the magnitude of the input sample received. For example a 00000000 is generated when the magnitude of the received input sample is less than Vref/8, a digital code 00000001 is generated when the magnitude of the input sample is between values Vref/8 and 2*Vref/8.

Combinatorial logic 850 is designed to close the desired ones of switches 840-1 through 840-N depending on the capacitance values of the individual capacitors and the desired magnitude of the dummy load. By choosing more capacitors with smaller capacitance values, the desired magnitude of dummy load may be obtained with correspondingly more precision.

However, for various design reasons well known in the relevant arts, it is desirable to keep the capacitance of each capacitor in dummy load 430 equal to the capacitance of each sampling capacitor (e.g., 330-1) used in a stage of the ADC (such that the parasitic loading is balanced out). An embodiment meeting such a requirement is described below in further detail.

6. Dummy Load Using Capacitors Having Equal Capacitance as Sampling Capacitors An embodiment is implemented taking advantage of the fact that the approximate maximum actual load offered by the circuit of FIG. 3A approximately equals ($2^n*Cs/4=2^{n-2}$ Cs), wherein Cs represents the capacitance of each sampling capacitor 330-1 and $2^n$ equals the number of sampling capacitors. Thus, in the case of n=3, the maximum actual load approximately equals 2 Cs.

However, as is well known in relevant arts, parasitic capacitance is not insignificant load in comparison to the load offered by the sampling capacitors. Thus, parasitic capacitors also need to be balanced while balancing the load. Hence, dummy load 430 may be implemented using unit capacitance value same as the sampling capacitor (330_1) used in a stage of the ADC.

Figure 9:
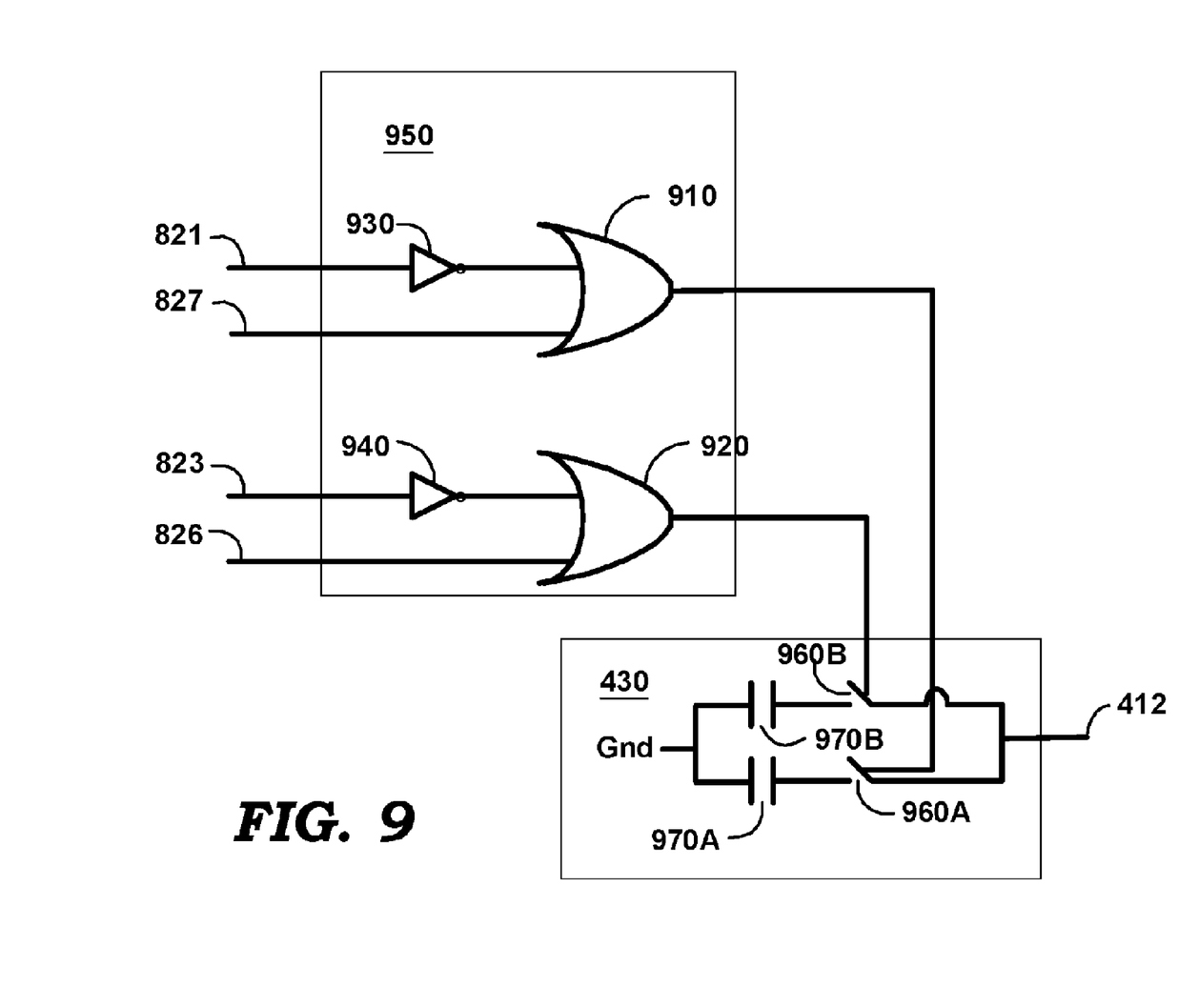
FIG. 9 is a block diagram illustrating the manner in which dummy load is implemented in one embodiment of the present invention.

FIG. 9 is a block diagram illustrating the manner in which dummy load 430 is implemented in one embodiment. The block diagram there is shown with combinatorial logic 950 and the details of dummy load 430. Combinatorial logic 950 is shown containing OR gates 910 and 920, and inverters 930 and 940, and dummy load 430 is shown containing switches 960A and 960B and corresponding capacitors 970A and 970B. Each component is described below in further detail.

Each capacitor 970A and 970B is designed with a capacitance of Cs (i.e., equal to each sampling capacitor), and thus dummy load 430 offers a load of 0, Cs or 2Cs depending on the number of switches 960A and 960B closed (as determined by the design of combinatorial logic 950).

Combinatorial logic 950 is designed to turn on a desired number of switches 960A and 960B depending on the magnitude of dummy load to be added to line 412. In an embodiment, dummy load equaling 2 times Cs is sought to be added in case the sub-code equals 0 and 8 (i.e., input voltage 111 in the ranges 610–611 and 617–618), Cs is sought to be added if sub-code equals 1, 2, 6 and 7 (i.e., input voltage 111 in the ranges 611–613 and 615–617), and 0 otherwise.

Such a requirement is implemented by having OR gate 910 receive inverted value of signal 821 and signal 827 as inputs and connecting the corresponding output to switch 960A. Similarly, OR gate 920 receives inverted value of signal 823 and signal 826 as inputs, and the corresponding output is connected to switch 960B.

When sub-code equals 0, signals 821 and 823 are at 0, causing inverters 930 and 940 generate is as outputs, which in turn causes both switches 960A and 960B to turn on. Thus, both capacitors 970A and 970B are connected to path 412, providing 2Cs as dummy load.

When sub-code equals 1 or 2, inverted signal of 821 and signal 827 are at 0, generating a logic 0 at the OR gate 910. However, inverter 940 generates a logic 1, causing OR gate 920 to generate a logic 1. As a result, only switch 960B is turned on, thereby connecting only capacitor 970B to path 412. In this case, dummy load equals Cs.

When sub-code equals 3, 4 or 5, signals 821 and 823 are at 1, and signals 826 and 827 are at 0. Thus, none of the switches 960A and 960B is turned on, thereby providing 0 dummy load. When sub-code equals 6 (one more than 5), signal 826 becomes 1, causing a dummy load of Cs. When sub-code equals 7, both signals 826 and 827 are at 1, causing 2Cs to be provided as dummy load.

Using approaches such as those described above, dummy load can be added to the path connecting a reference buffer to the driven component(s) in the durations of interest 391–392 to provide at least a substantially constant reference voltage to the component(s). Due to the use of such approaches, a substantially constant reference voltage is provided at least in the hold durations (391–392), as desired.

However, as may be appreciated from the description above, the aggregate load on path 412 does not precisely equal a constant value due to various approximations (e.g., use of fewer capacitors as in FIG. 9 and also use of the same dummy load between two quantization input voltage levels) used above. The aggregate load values are depicted in the graph (X-axis representing the input voltage level and Y-axis the deviation voltage from the constant value) of FIG. 10. As seen there, the aggregate load jumps when transitioning to a higher quantized digital code, and reduces gradually until the next quantized level of the input voltage signal is reached.

The embodiment(s) of above can be implemented in various devices/systems. Some of such devices may require constant reference voltages in substantially smaller durations (compared to hold durations 391–392), depending on the specific requirements. The description is continued with respect to an example device in which various aspects of the present invention are implemented.

7. Device

Figure 11:
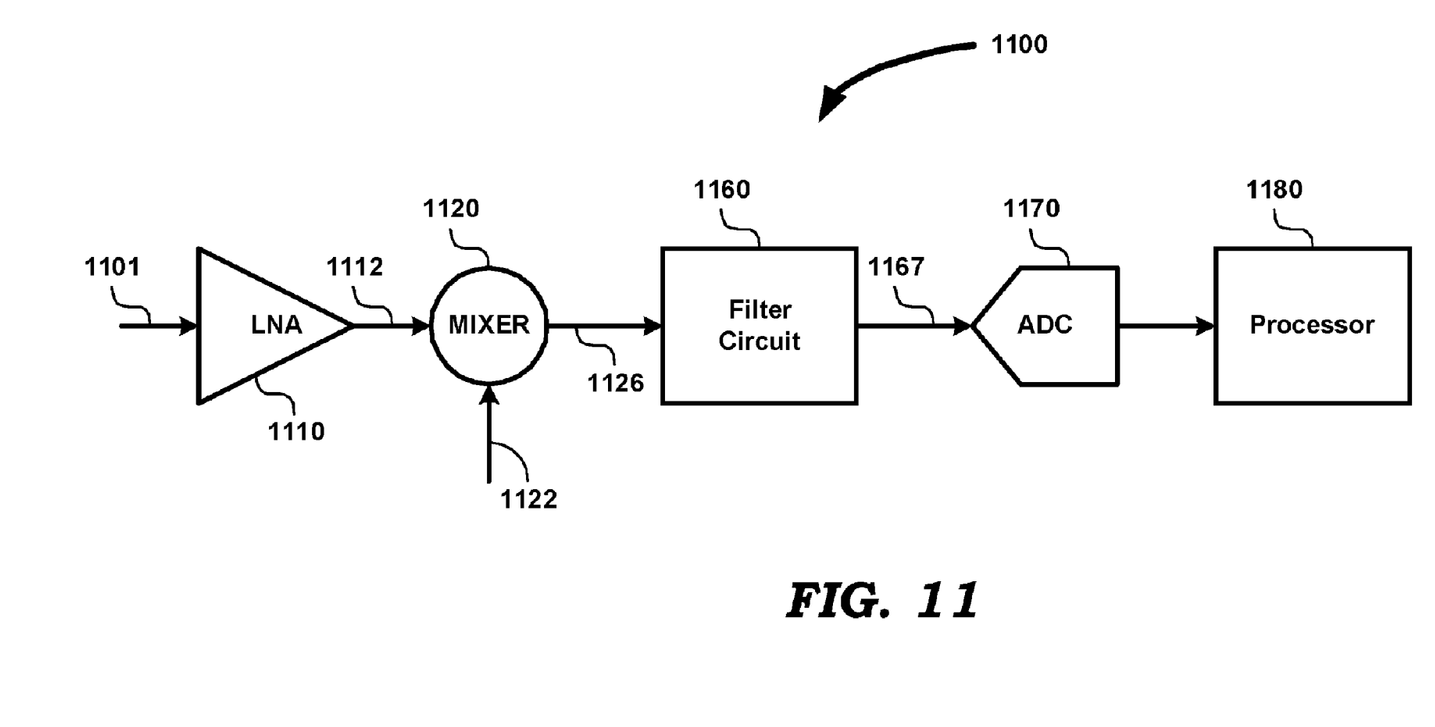
FIG. 11 is a block diagram of a receiver system illustrating an example system in which various aspects of the present invention may be implemented.

FIG. 11 is a block diagram of receiver system 1100 illustrating an example system in which various aspects of the present invention may be implemented. For illustration, it is assumed that receiver system 1100 is implemented within a Wireless Receiver. However, receiver system 1100 can be implemented in other devices (wireless as well as wire_based communications) as well.

Receiver system 1100 is shown containing low noise amplifiers (LNA) 1110, mixer 1120, filter circuit 1160, analog to digital converter (ADC) 1170, and processor 1180. Each block/stage is described in further detail below.

LNA 1110 receives signals on path 1101 and amplifies the received signals to generate a corresponding amplified signal on path 1112. For example, in wireless systems, the signals that are transmitted from satellites, etc. may be received by an antenna (not shown) and the received signals are provided on path 1101. The received signals may be weak in strength and thus amplified by LNA 1110 for further processing. LNA 1110 may be implemented in a known way.

Mixer 1120 may be used to down_convert the received amplified signal on path 1112 into an intermediate signal with the frequency band of interest centered at a lower frequency than the carrier frequency of the received signal. In an embodiment, a signal with the frequency band of interest centered at 2.4 GHZ (carrier frequency) is converted to a signal with the frequency band of interest centered at zero frequency.

Mixer 1120 may receive the amplified signal on path 1112 and a signal of fixed frequency on path 1122 as inputs, and provides the intermediate signal on path 1126. The signal of fixed frequency on path 1122 may be generated by a phase locked loop (not shown) in a known way.

Filter circuit 1160 may correspond to a low pass filter, which allows the desired low frequencies and rejects all other unwanted high frequencies present in the signal received on line 1126. The filtered signal, which contains the frequency band of interest, is provided on path 1167.

ADC 1170 converts (samples) the filtered signal received on path 1167 to a corresponding digital value, which represents the signal of interest in received signal 1101. Processor 1180 processes the received digital values to provide various user applications and may be implemented as multiple processing units, each potentially operating independently. ADC 1170 may correspond to ADC 100 described in sections above (and implemented according to various aspects of the present invention).

8. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. A method of reducing variation in a reference voltage provided to a component in a plurality of time durations, said method comprising:

providing a reference buffer coupled to said component by a path, wherein said reference buffer provides said reference voltage;

estimating an actual load that would be offered to said reference buffer in each of said plurality of time durations where said actual load depends upon an input analog signal to said component; and adding a dummy load of corresponding desired magnitudes on said path in each of said plurality of time durations, wherein the aggregate load of said dummy load and said actual load equals a substantially constant load.

2. The method of claim 1, wherein said component comprises a stage of an analog to digital converter (ADC), wherein said plurality of time durations are contained in a hold phase, wherein said hold phase follows a sampling phase, wherein a digital code corresponding to each sample is generated in said sampling phase, wherein said estimating comprises:

receiving said digital code; and determining said actual load based on said digital code.

3. The method of claim 2, wherein said stage comprises a plurality of sampling capacitors sampling said sample in said sampling phase, wherein a first set of capacitors contained in said plurality of sampling capacitors are connected to said reference buffer in said hold phase, wherein said determining is performed according to:

$$C_L = C_n(Vref - Vin)/Vref$$

wherein $C_n$ represents the aggregate capacitance value of said first set of capacitors, Vref equals a constant voltage, $C_L$ represents said actual load, and Vin represents the charge equivalent voltage across each of said set of capacitors.

4. The method of claim 2, wherein said dummy load comprises a plurality of dummy capacitors, wherein said adding comprises:

connecting a set of dummy capacitors contained in said plurality of dummy capacitors in each time duration, wherein said set of dummy capacitors is determined to cause said aggregate load to equal said constant load.

5. The method of claim 4, wherein said sub-code is generated in the form of $2^P$ digital bits, wherein P equal the number of bits in said sub-code, wherein each of said $2^P$ digital bits provides a result of comparison of said sample with a corresponding quantized level generated from said Vref, wherein said connecting is based on a subset of said $2^P$ digital bits.

6. A voltage generation circuit for providing a reference voltage having a substantially constant value to a component in a plurality of time durations, said voltage generation circuit comprising:

a reference buffer coupled to said component by a path, wherein said reference buffer provides said reference voltage, wherein said component provides an actual load on said path in a desired duration where said actual load depends upon an input analog signal to said component; and a dummy circuit designed to add a dummy load to said path such that the aggregate load of said dummy load and said actual load at least substantially equals a substantially constant load such that said reference buffer provides said reference voltage with said substantially constant value to said component in said desired duration.

7. The voltage generation circuit of claim 6, wherein said component comprises a stage of an analog to digital converter (ADC), wherein said plurality of time durations are contained in a hold phase, wherein said hold phase follows a sampling phase, said voltage generation circuit further comprises:

a sub-ADC generating a digital code proportionate to the voltage level of a sample in said sampling phase; and a logic circuit receiving said digital code and causing said dummy circuit to provide said dummy load with a desired magnitude determined based on said digital code.

8. The voltage generation circuit of claim 7, wherein said stage comprises a plurality of sampling capacitors sampling said sample in said sampling phase, wherein a first set of capacitors contained in said plurality of sampling capacitors are connected to said reference buffer in said hold phase, wherein said desired magnitude is determined according to:

$$C_L = C_n(Vref - Vin)/Vref$$

wherein $C_n$ represents the aggregate capacitance value of said first set of capacitors and is determined based on said digital code, Vref equals a constant voltage, $C_L$ represents said actual load, and Vin represents the charge equivalent voltage across each of said set of capacitors.

9. The voltage generation circuit of claim 7, wherein said dummy load comprises a plurality of dummy capacitors, said voltage generation circuit further comprising:

a plurality of switches, with each switch connecting a corresponding one of said plurality of dummy capacitors to said path depending on a corresponding one of a plurality of control signals, wherein said logic circuit generates said plurality of control signals to close a set of dummy capacitors contained in said plurality of dummy capacitors in each time duration, wherein said set of dummy capacitors is determined to cause said aggregate load to equal said substantially constant load.

10. The voltage generation circuit of claim 9, wherein the capacitance of each of said plurality of dummy capacitors equals the capacitance of each of said sampling capacitors.

11. The voltage generation circuit of claim 10, said sub-code is generated in the form of $2^P$ digital bits, wherein P equal the number of bits in said sub-code, wherein each of said $2^P$ digital bits provides a result of comparison of said sample with a corresponding quantized level generated from said Vref, wherein said connecting is based on a subset of said $2^P$ digital bits.

12. The voltage generation circuit of claim 11, wherein said logic comprises combinatorial logic only.

13. A device comprising:

a processor processing a plurality of digital values; and an analog to digital converter (ADC) sampling an analog signal to generate said plurality of digital values, said ADC comprising a voltage generation circuit for providing a reference voltage having a substantially constant value to a component in a plurality of time durations, said voltage generation circuit comprising:

a reference buffer coupled to said component by a path, wherein said reference buffer provides said reference voltage, wherein said component provides an actual load on said path in a desired duration and wherein said actual load depends upon an input analog signal to said component; and a dummy circuit designed to add a dummy load to said path such that the aggregate load of said dummy load and said actual load at least substantially equals a constant load such that said reference buffer provides said reference voltage with said substantially constant value to said component in said desired duration.

14. The device of claim 13, wherein said component comprises a stage of said analog to digital converter (ADC), wherein said plurality of time durations are contained in a hold phase, wherein said hold phase follows a sampling phase, said voltage generation circuit further comprises:

a sub-ADC generating a digital code proportionate to the voltage level of a sample in said sampling phase; and a logic circuit receiving said digital code and causing said dummy circuit to provide said dummy load with a desired magnitude determined based on said digital code.

15. The device of claim 14, wherein said stage comprises a plurality of sampling capacitors sampling said sample in said sampling phase, wherein a first set of capacitors contained in said plurality of sampling capacitors are connected to said reference buffer in said hold phase, wherein said desired magnitude is determined according to:

$$C_L = C_n(Vref - Vin)/Vref$$

wherein $C_n$ represents the aggregate capacitance value of said first set of capacitors and is determined based on said digital code, Vref equals a constant voltage, $C_L$ represents said actual load, and Vin represents the charge equivalent voltage across each of said set of capacitors.

16. The device of claim 15, wherein said dummy load comprises a plurality of dummy capacitors, said voltage generation circuit further comprising:

a plurality of switches, with each switch connecting a corresponding one of said plurality of dummy capacitors to said path depending on a corresponding one of a plurality of control signals, wherein said logic circuit generates said plurality of control signals to close a set of dummy capacitors contained in said plurality of dummy capacitors in each time duration, wherein said set of dummy capacitors is determined to cause said aggregate load to equal said substantially constant load.

17. The device of claim 16, wherein the capacitance of each of said plurality of dummy capacitors equals the capacitance of each of said sampling capacitors.

18. The device of claim 17, said sub-code is generated in the form of $2^P$ digital bits, wherein P equal the number of bits in said sub-code, wherein each of said $2^P$ digital bits provides a result of comparison of said sample with a corresponding quantized level generated from said Vref, wherein said connecting is based on a subset of said $2^P$ digital bits.

19. The device of claim 18, wherein said logic comprises combinatorial logic only.

20. An apparatus for providing a reference voltage having a substantially constant value to a component in a plurality of time durations, said apparatus comprising:

means for providing a reference buffer coupled to said component by a path, wherein said reference buffer provides said reference voltage;

means for estimating an actual load that would be offered to said reference buffer in each of said plurality of time durations where said actual load depends upon an input analog signal to said component; and     means for adding a dummy load of corresponding desired magnitudes on said path in each of said plurality of time durations, wherein the aggregate load of said dummy load and said actual load equals a substantially constant load such that said reference buffer provides said reference voltage with said substantially constant value to said component in all of said plurality of time durations.

* * * * *